United States Patent
Wright, Jr. et al.

(10) Patent No.: US 11,624,111 B2
(45) Date of Patent: Apr. 11, 2023

(54) METHOD FOR ETCHING OR DEPOSITION

(71) Applicant: ENTEGRIS, INC., Billerica, MA (US)

(72) Inventors: Robert L. Wright, Jr., Newtown, CT (US); Thomas H. Baum, New Fairfield, CT (US); David M. Ermert, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/150,942

(22) Filed: Jan. 15, 2021

(65) Prior Publication Data

US 2021/0222292 A1 Jul. 22, 2021

Related U.S. Application Data

(60) Provisional application No. 62/961,939, filed on Jan. 16, 2020.

(51) Int. Cl.
  *C23C 16/08* (2006.01)
  *C23C 16/44* (2006.01)
  *C23C 16/455* (2006.01)
  *C23C 16/02* (2006.01)

(52) U.S. Cl.
  CPC .......... *C23C 16/08* (2013.01); *C23C 16/0236* (2013.01); *C23C 16/4408* (2013.01); *C23C 16/45525* (2013.01)

(58) Field of Classification Search
  CPC . C23C 16/08; C23C 16/0236; C23C 16/4408; C23C 16/45525
  See application file for complete search history.

(56) References Cited

U.S. PATENT DOCUMENTS

| | | | |
|---|---|---|---|
| 10,002,772 B2 * | 6/2018 | Hendrix | H01L 21/31122 |
| 2002/0176927 A1 * | 11/2002 | Kodas | B01J 19/0046 |
| | | | 427/407.1 |
| 2007/0049045 A1 | 3/2007 | Zimmerman | |
| 2013/0302980 A1 | 11/2013 | Chandrash | |
| 2014/0273451 A1 * | 9/2014 | Wang | C23C 16/56 |
| | | | 438/675 |
| 2015/0348840 A1 * | 12/2015 | Bamnolker | H01L 21/76877 |
| | | | 438/669 |
| 2017/0040214 A1 * | 2/2017 | Lai | H01L 21/76877 |
| 2017/0062224 A1 * | 3/2017 | Fu | C23C 16/06 |
| 2017/0204126 A1 * | 7/2017 | Dussarrat | H01L 51/5228 |
| 2017/0268107 A1 * | 9/2017 | Lansalot-Matras | C23C 16/30 |
| 2018/0019165 A1 | 1/2018 | Baum et al. | |
| 2019/0074219 A1 * | 3/2019 | Zhang | H01L 21/76897 |
| 2019/0341268 A1 * | 11/2019 | Zhang | H01L 29/4966 |
| 2019/0341302 A1 * | 11/2019 | Lei | H01L 21/02205 |

FOREIGN PATENT DOCUMENTS

| | | | | |
|---|---|---|---|---|
| EP | 1105356 B1 * | 4/2003 | | C03C 17/245 |
| JP | H 0923287 * | 9/1997 | | H01L 21/3065 |
| WO | WO 2016/006231 A1 * | 1/2016 | | C09D 1/00 |
| WO | 2019213604 A1 | 11/2019 | | |
| WO | WO 2019/213604 * | 11/2019 | | C23C 16/44 |

OTHER PUBLICATIONS

Kirss, Rein U., et al., "Chemical Vapor Deposition of Tungsten Oxide". Applied Organometallic Chemistry, vol. 12, 155-160 (1998).*
Lee, Yonghyun, et al., "Synthesis of Tungsten-Doped Vanadium Dioxide Using a Modified Polyol Method Involving 1-Dodecanol". Materials, 2020 13, 5384, pp. 1-13.*
Ohba, Takayuki, et al., "Chemical Vapour Deposition of Tungsten by the Reduction of $WF_6$ using Si, $SiH_4$, $Si_2H_6$, $Si_3H_8$, $B_2H_6$, $PH_3$, and $H_2$". IETE Journal of Research, vol. 37, Issue 2, 1991, one page. Abstract Only.*
Becker, Jill S., et al., "Highly Conformal Thin Films of Tungsten Nitride Prepared by Atomic Layer Deposition from a Novel Precursor". Chem. Mater. 2003, 15, 2969-2976.*

* cited by examiner

*Primary Examiner* — Bret P Chen

(57) ABSTRACT

A methodology for (a) the etching of films of $Al_2O_3$, $HfO_2$, $ZrO_2$, W, Mo, Co, Ru, SiN, or TiN, or (b) the deposition of tungsten onto the surface of a film chosen from $Al_2O_3$, $HfO_2$, $ZrO_2$, W, Mo, Co, Ru, Ir, SiN, TiN, TaN, WN, and $SiO_2$, or (c) the selective deposition of tungsten onto metallic substrates, such as W, Mo, Co, Ru, Ir and Cu, but not metal nitrides or dielectric oxide films, which comprises exposing said films to $WOCl_4$ in the presence of a reducing gas under process conditions.

19 Claims, 9 Drawing Sheets

METHOD FOR ETCHING OR DEPOSITION

TECHNICAL FIELD

This disclosure relates generally to the etching of certain materials, including alumina, zirconia, hafnia, and combinations thereof, and titanium nitride, tantalum nitride, tungsten nitride, and the deposition of tungsten onto certain materials, including tungsten, molybdenum, cobalt, ruthenium, aluminum, alumina, titanium nitride, tantalum nitride, tungsten nitride and silicon dioxide films present on microelectronic devices, using $WOCl_4$.

BACKGROUND

There is considerable interest in the etching of alumina ($Al_2O_3$) surfaces appearing as capacitor films on many microelectronic devices, especially utilizing atomic layer etching. Current processes generally require multiple steps and are complex and costly. Additionally, nucleation of metals and accordant deposition in general on the surface of an alumina film has proven to be difficult, and even when successful, adhesion between these two materials has been less than satisfactory. Moreover, existing methods do not generally provide conformal coverage of tungsten on the alumina surface. The deposition of tungsten metal to a variety of substrates may be desired for the application of contacts, interconnects, nucleation layers, seed layers, and for hard mask applications. For all of these possible applications, high-purity metals with uniformity within the deposited film is desirable towards achieving the highest level of performance for the deposited films.

SUMMARY

In general, the disclosure provides a method for (a) the etching of films of $Al_2O_3$, $HfO_2$, $ZrO_2$, W, Mo, Co, Ru, SiN, or TiN, or (b) the deposition of tungsten onto the surface of a film chosen from $Al_2O_3$, $HfO_2$, $ZrO_2$, W, Mo, Co, Ru, Ir, SiN, TiN, TaN, WN, and $SiO_2$, which comprises exposing said films to $WOCl_4$ in the presence of a reducing gas under heterogenous process conditions in which a film is etched or tungsten is deposited onto a surface of a film. The bias between a predominantly etching process or a predominantly deposition process can be controlled by: 1) varying the temperature of the substrate (i.e., ($T_{sub}$)); 2) the gas-phase concentration of the $WOCl_4$ precursor, either via manipulation of precursor vapor pressure, deposition (or etching) pressure or concentration directly; and/or 3) the type of substrate being exposed to $WOCl_4$ vapor.

Accordingly, in one aspect, the disclosure provides a method comprising:
 exposing a substrate to $WOCl_4$ and a reducing gas in a reaction zone under:
  (a) a first set of heterogeneous process conditions to controllably etch a substrate, wherein the substrate comprises a film chosen from $Al_2O_3$, TiN, $HfO_2$, $ZrO_2$, W, Mo, Co, Ru, and SiN films; or
  (b) a second set of heterogeneous process conditions to controllably deposit tungsten onto the surface of a substrate, wherein the substrate comprises a film chosen from $Al_2O_3$, $HfO_2$, $ZrO_2$, W, Mo, Co, Ru, SiN, TiN, and $SiO_2$ films.

In another aspect, the disclosure provides a method comprising:
 exposing a substrate comprising a film chosen from $Al_2O_3$, TiN, $HfO_2$, $ZrO_2$, W, Mo, Co, Ru, and SiN films, to (i) $WOCl_4$ along with a carrier gas delivered from a precursor ampoule, and (ii) a reducing gas, in a reaction zone, wherein the pressure in the reaction zone is about 0.5 to 500 Torr; the substrate temperature is about 200° C. to 1000° C., the reducing gas flow rate is about 0.1 to 10 liters per minute, the carrier gas flow is from about 0.001 to 1 liters per minute, the concentration of $WOCl_4$ in the reaction zone is greater than 1000 ppm, and the precursor ampoule temperature is about 10° C. to about 180° C., whereby the substrate comprising a film chosen from $Al_2O_3$, TiN, $HfO_2$, $ZrO_2$, W, Mo, Co, Ru, and SiN films is etched.

In another aspect, the disclosure provides a method comprising:
 exposing a substrate comprising a film chosen from $Al_2O_3$, $HfO_2$, $ZrO_2$, W, Mo, Co, Ru, SiN, TiN, and $SiO_2$ films, to (i) $WOCl_4$ along with a carrier gas delivered from a precursor ampoule, and (ii) a reducing gas, in a reaction zone, wherein the pressure in the reaction zone is about 0.5 Torr to 500 Torr; the substrate temperature is about 200° C. to 1000° C., the reducing gas flow rate is about 0.1 to 10 liters per minute, the carrier gas flow is from about 0.001 to 1 liters per minute, the concentration of $WOCl_4$ is less than 1000 ppm, and the precursor ampoule temperature is about 10° C. to about 180° C., whereby tungsten is deposited onto the surface of the substrate comprising a film chosen from $Al_2O_3$, $HfO_2$, $ZrO_2$, W, Mo, Co, Ru, SiN, TiN, and $SiO_2$ films.

In another aspect, the disclosure provides a method comprising:
 exposing a substrate comprising a film selected from $Al_2O_3$, $HfO_2$, $ZrO_2$, W, Mo, Co, Ru, Cu, Ir, SiN, TiN, and $SiO_2$ films, to (i) $WOCl_4$ along with a carrier gas delivered from a precursor ampoule, and (ii) a co-reactant reducing gas, in a reaction zone, wherein the pressure in the reaction zone is about 0.5 Torr to 500 Torr; the substrate temperature is about 200° C. to 1000° C., the reducing gas flow rate is about 0.1 to 10 liters per minute, the carrier gas flow is from about 0.001 to 1 liters per minute, the concentration of $WOCl_4$ is less 1000 ppm, and the precursor ampoule temperature is about 10° C. to about 180° C., whereby tungsten is deposited selectively onto a metal conductor film, such as W, Mo, Co, Ru, Cu, Ir and other suitable metal conductor films, but not deposited onto nitrides and/or dielectric oxide films.

BRIEF DESCRIPTION OF THE DRAWINGS

The disclosure may be more completely understood in consideration of the following description of various illustrative embodiments in connection with the accompanying drawings

Figure 1:
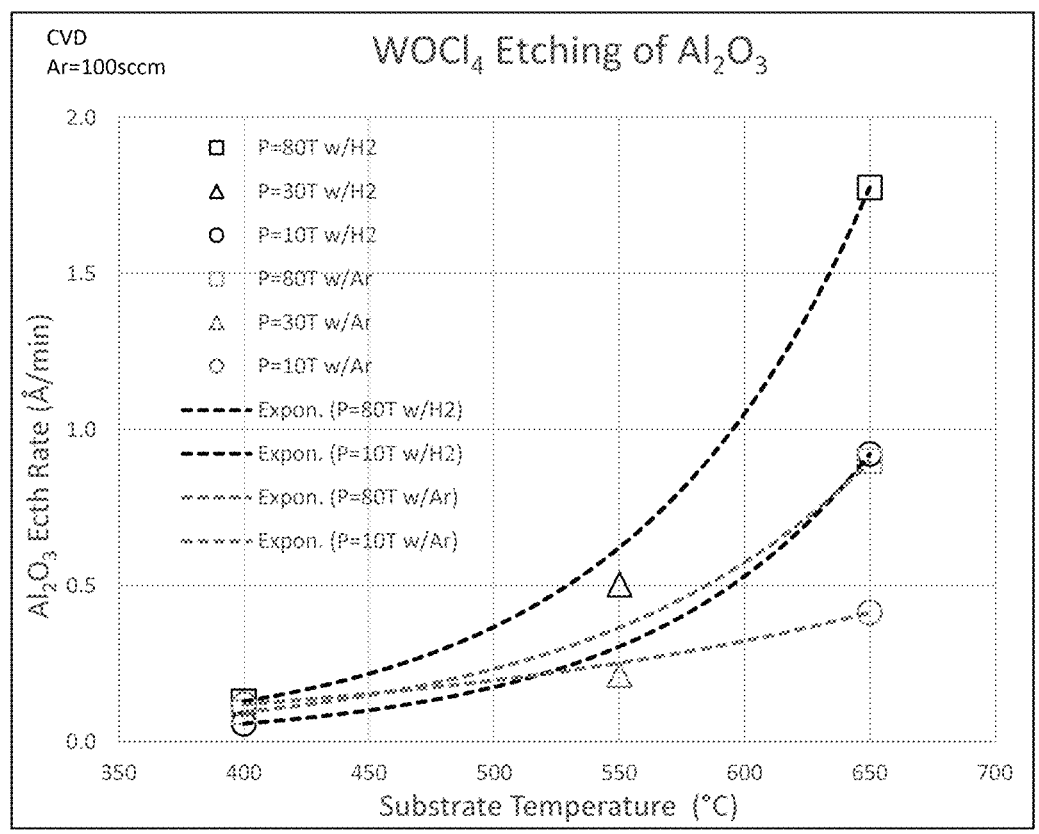
FIG. 1 is a plot of $Al_2O_3$ etch rate (Å/minute) versus Substrate Temperature (° C.) in a chemical vapor etching (CVE) process.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

As noted above, in a first aspect, the disclosure provides a method comprising: exposing a substrate to $WOCl_4$ and a reducing gas in a reaction zone under:
(a) a first set of process conditions to controllably etch a substrate film comprising $Al_2O_3$ or TiN; or
(b) a second set of process conditions to controllably deposit tungsten onto the surface of a substrate, wherein the substrate is chosen from $Al_2O_3$, $HfO_2$, $ZrO_2$, W, Mo, Co, Ru, SiN, TiN, and $SiO_2$ films.

In general, the process conditions referred to above are those conditions common to chemical vapor deposition and atomic layer deposition. In this regard, the pressure is generally from about 1 Torr to about 80 Torr and the temperature is about 350° C. to about 750° C. The $WOCl_4$ precursor material is fed into a reaction chamber with the desired substrate with an inert carrier gas such as argon, helium or nitrogen along with a co-reactant reducing gas, such as hydrogen. A co-reactant reducing gas is a gas that is introduced into the system to react with precursor material to generate an intermediate compound and/or reaction byproduct. The films can be deposited or etched by use of a CVD, pulsed CVD, and/or ALD reaction process.

The co-reactant reducing gas can be chosen from those known in the CVD/ALD art and includes $H_2$, $NH_3$, hydrazines and alkylated hydrazines (such as $N_2H_4$, $CH_3HNNH_2$, $CH_3HNNHCH_3$).

In certain embodiments, the method is conducted in a single phase and the substrate is treated for a chosen period of time under controllable conditions to effect either etching of the chosen film or deposition of tungsten on the chosen film. In certain embodiments and process conditions, etching occurs first, followed by deposition.

In other embodiments, the reaction can be conducted in a pulsing process. In this process, sequential processing steps are generally referred to as "pulses" or cycles. Such processes are based on controlled, self-limiting surface reactions of precursor chemical(s). Gas phase reactions are avoided by alternately and sequentially contacting the substrate with the precursor(s). Process reactants are separated from each other in time and on the substrate surface, for example, by removing excess reactants and/or reactant byproducts from the reaction chamber between reactant pulses. In some embodiments, the precursor is pulsed into the chamber, while the co-reactant reducing gas is continuously flowed into the reactor. This embodiment would be termed 'pulsed CVD' mode. In some embodiments, one or more substrate surfaces are alternately and sequentially contacted with two or more process precursors, or reactants. Contacting a substrate surface with a vapor-phase reactant means that the reactant vapor is in contact with the substrate surface for a limited or controlled period of time. In other words, it can be understood that the substrate surface is exposed to process precursor for a limited period of time.

Figure 9:
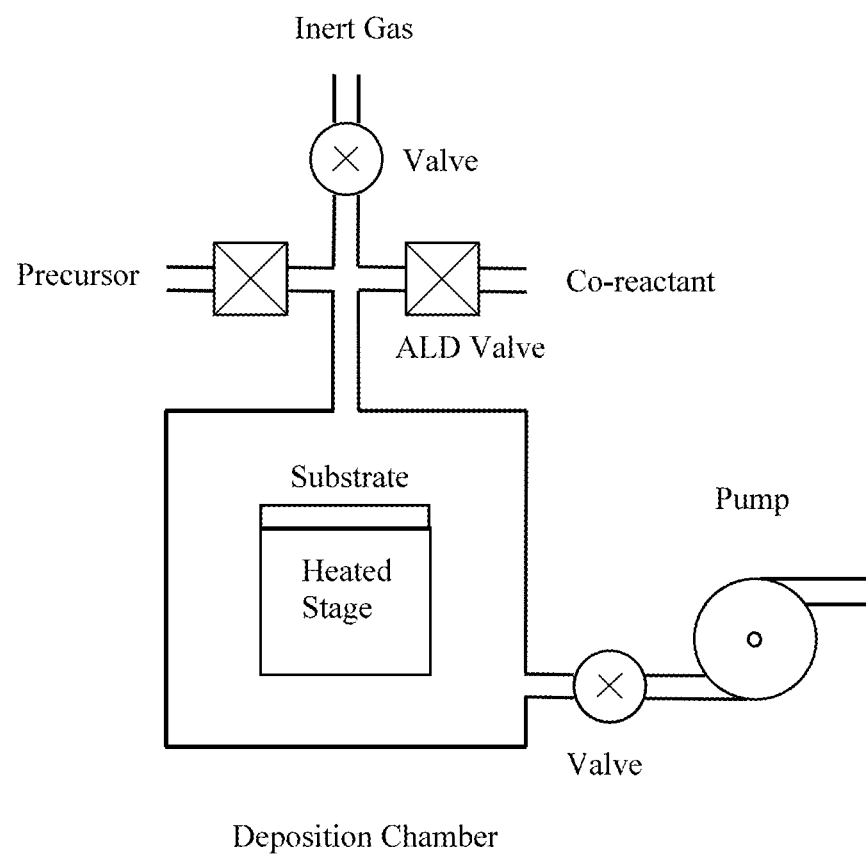
FIG. 9 is a simplified depiction of a suitable reaction chamber for carrying out the method of the disclosure.

Reactors capable of being used to grow thin films can be used for the deposition described herein. Such reactors include ALD reactors, as well as CVD reactors equipped with appropriate equipment and means for providing the precursor (e.g., $WOCl_4$) and co-reactant (i.e., reducing gas) in a "pulsed" manner. According to certain embodiments, a showerhead in the reactor may also be used to provide uniform delivery of the $WOCl_4$ precursor to the wafer. Examples of suitable reactors that may be used include commercially available equipment, as well as home-built reactors, and will be known to those skilled in the art of CVD, pulsed CVD and/or ALD. An exemplary reactor is shown in FIG. 9.

Briefly, the substrate comprising the desired film set forth above is heated to a suitable deposition or etching temperature ranging from 200° C. to 1000° C., generally at pressures of from about 0.5 to 500 Torr. In other embodiments, the temperature is from about 350° C. to 700° C. or 400° C. to 600° C. Deposition or etching temperatures are generally maintained below the thermal decomposition temperature of the $WOCl_4$ precursor, and high enough to avoid condensation of reactants and to provide enough energy for the activation of the desired surface reactions. The surface of the substrate is contacted with $WOCl_4$ precursor. In certain embodiments, a pulse of $WOCl_4$ precursor is provided to a reaction space containing the substrate. In other embodiments, the substrate is moved to a reaction space containing $WOCl_4$ precursor. Process conditions are generally selected such that no more than about one monolayer of the $WOCl_4$ precursor is adsorbed on the substrate surface in a self-limiting manner. The appropriate contacting times can be readily determined by the skilled artisan based on the specific process conditions, substrates and reactor configurations. Excess $WOCl_4$ precursor and reaction by-products, if any, are removed from the substrate surface, such as by purging with an inert gas, purging with a reducing gas or by removing the substrate from the presence of the first reactant.

Purging means that process precursors and/or process by-products are removed from the substrate surface and process chamber, such as by evacuating a chamber with a vacuum pump and/or by replacing the gas inside a reactor with an inert gas such as argon, helium, or nitrogen, and/or by replacing the gas inside a reactor with a reducing gas, such as hydrogen. In certain embodiments, purging times are from about 0.05 to 120 seconds, between about 0.05 and 10, or between about 0.05 and 2 seconds. However, other purge times can be utilized if necessary, such as where highly conformal step coverage over extremely high aspect ratio structures or other complex surface morphology structures are encountered.

In some embodiments, each phase of each cycle is generally self-limiting. An excess of reactant precursor is supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during each cycle.

Removing excess reactants can include evacuating some of the contents of a reaction space and/or purging a reaction space with helium, nitrogen, argon or another inert gas. In some embodiments, purging can be performed with a reducing gas. In certain embodiments, purging can comprise turning off the flow of the reactive gas while continuing to flow an inert carrier gas or a reducing gas to the reaction space. In another embodiment, the purge step may employ a vacuum step to remove excess reactant from the surface. In certain embodiments, the $WOCl_4$ precursor is pulsed into a reaction chamber containing the substrate/film for a period of about 0.05 to about 20 seconds, and then while not pulsed, carrier gas and the co-reactant reducing gas are continuously flowed into the reactor, thus serving to purge excess precursor from the reaction chamber. In a separate embodiment, the precursor is pulsed into the reaction chamber, then purged, reducing gas is pulsed into the reactor and then purged and this cycle is repeated to achieve the desired thickness of the deposited tungsten film or to remove by etching a desired thickness of the exposed film.

In a method of the disclosure, the use of the precursor $WOCl_4$ is biased toward thin-film tungsten deposition with the following conditions:
pressure=>0.5 Torr to 500 Torr;
temperature=>200° C. to 1000° C.;
$H_2$ flow rate=>0.1 to 10 liters per minute;
carrier gas flow=>0.001 to 1 liters per minute; and
precursor ampoule temperature=>10° C. to 180° C.

The deposition of tungsten onto various substrates depends directly on the concentration of the $WOCl_4$ precursor, which is expressed herein as $[WOCl_4]$, the substrate identity and the substrate temperature. In general, but not strictly speaking, concentrations of <1000 ppm of $WOCl_4$ is required to effect tungsten film growth in the CVD process as set forth herein.

Additionally, or alternatively, according to a method of the disclosure, $WOCl_4$ is biased toward substrate etching under the following conditions:
pressure=>0.5 Torr to 500 Torr;
temperature=>200° C. to 1000° C.;
$H_2$ flow rate=>0.1 to 10 liters per minute;
carrier gas flow=>0.001 to 1 liters per minute; and
precursor ampoule temperature=>10° C. to 180° C.

The etching of various substrates depends directly on the concentration of precursor $[WOCl_4]$, the substrate identity and the substrate temperature. In general, but not strictly speaking, concentrations of $[WOCl_4]$>1000 ppm in a continuous exposure mode (i.e., CVE=chemical vapor etching) process. The concentration of precursor depends on combination of $[WOCl_4]$, substrate material and substrate temperature.

Further, additionally or alternative, according to a method of the disclosure, tungsten is selectively deposited onto a metal conductor film by exposing a substrate including a film selected from $Al_2O_3$, $HfO_2$, $ZrO_2$, W, Mo, Co, Ru, Cu, Ir, SiN, TiN, and $SiO_2$ films, to (i) $WOCl_4$ along with a carrier gas delivered from a precursor ampoule, and (ii) a co-reactant reducing gas, in a reaction zone, under the following conditions:
pressure in the reaction zone is about 0.5 Torr to 500 Torr;
the substrate temperature is about 200° C. to 1000° C.,
the reducing gas flow rate is about 0.1 to 10 liters per minute,
the carrier gas flow is from about 0.001 to 1 liters per minute,
the concentration of $[WOCl_4]$ is less 1000 ppm, and
the precursor ampoule temperature is about 10° C. to about 180° C., As a result of such process conditions, whereby tungsten deposited selectively onto a metal conductor film, such as W, Mo, Co, Ru, Cu, Ir and other suitable metal conductor films, but not deposited onto nitrides and/or dielectric oxide films.

Examples

TABLE 1

| Ex | Pressure (Torr) | Substrate Temp. (° C.) | W Etched/ Deposited (Å/min.) | TiN Etched/ Deposited (Å/min.) | $Al_2O_3$ Etched/ Deposited in $H_2$ (Å/min.) | $Al_2O_3$ Etched/ Deposited in Ar (Å/min.) | $SiO_2$ Etched/ Deposited (Å/Min.) |
|---|---|---|---|---|---|---|---|
| Initial film Thickness | | | 1000 | 15 | 40 | 40 | 4000 |
| 1 | 80 | 650 | +206.3 | +65.8 | −1.78 | −0.90 | + |
| 2 | 80 | 400 | −0.05 | −0.35 | −0.13 | −0.10 | −0.1 |
| 3 | 30 | 550 | +16.77 | −1.49 | −0.50 | −0.21 | 0 |
| 4 | 10 | 650 | +0.67 | −1.49 | −0.92 | −0.41 | 0 |
| 5 | 10 | 400 | −1.49 | −0.87 | −0.06 | −0.12 | 0 |

In Examples 1-5, the results of which are summarize in the above Table 1, measurements were taken before and after using X-ray fluorescence (XRF). A positive (+) number indicates tungsten film deposition and a negative number (−) represents substrate film etching. In these experiments, the $WOCl_4$ ampoule temperature was set at 90° C., the Ar carrier gas flow was set at 100 sccm (standard cubic centimeters per minute, i.e., flow rate), and the $WOCl_4$ was exposed to the substrates for roughly 600 seconds. As can be seen in the table, $Al_2O_3$ had the highest etch rate per minute exposure in this study, due to the lack of competing tungsten deposition processes noted at the higher temperatures. Additionally, it can be observed that the etch rate was dependent on the precursor [$WOCl_4$] concentration, the substrate identity, and $T_{sub}$ (i.e., substrate temperature). Higher precursor concentrations and higher substrate temperatures lead to substrate etching, while tungsten deposition was observed when the concentration of the precursor was too low to effect etching of the substrate. Tungsten deposition was observed to occur at 550° C. (16 Å/minute) and 650° C. (206 Å/Minute), while substrate etching occurred at 400° C. (1.5 Å/minute). In these tungsten deposition examples, resistivity of the resulting film was found to be as low as 11.5 $\mu\Omega$-cm (Example 3) on tungsten substrates and on 26.7 $\mu\Omega$-cm TiN substrates. Additionally, high precursor concentration was shown to lead to columnar crystal growth on tungsten substrates, i.e., isolated grains, and higher resistivity (19$\mu\Omega$-cm) at higher $T_{sub}$.

As can be noted by the data in Table 1, the selective deposition of tungsten metal onto tungsten or other suitable metal conductor films, such as Mo, Co, Ru, Ir and Cu, instead of tungsten deposition onto nitrides and/or dielectric oxide films, can be achieved by careful control of the process conditions during deposition. In some embodiments, a pre-etching of the substrate, prior to selective deposition, may be employed to enhance contact resistance and thin-film adhesion properties. Not wishing to be bound by theory, but the selective deposition of tungsten metal onto other suitable metal conductor films, such as Mo, Co, Ru, Ir and Cu instead of tungsten deposition onto nitrides and/or dielectric oxide films, also can be achieved by careful control of the process conditions during deposition.

TABLE 2

| Example | Stage Temp. (° C.) | Precursor chamber pressure (Torr) | Pre Buffer Thickness (Å) | Post Buffer Thickness (Å) | W Thickness (Å) | Pre-Process Resistance ($\Omega$/sq) | TiN etched (Å) |
|---|---|---|---|---|---|---|---|
| 6 | 693 | 80 | 14.7 | 11.39 | 657.8 | 71.5 | 3.4 |
| 7 | 414 | 80 | 14.5 | 11.05 | 0.0 | 65.0 | 3.5 |
| 8 | 578 | 30 | 14.9 | 0.03 | 0.0 | 55.3 | 14.9 |
| 9 | 693 | 10 | 14.9 | 0 | 0.0 | 49.8 | 14.9 |
| 10 | 414 | 10 | 15.0 | 6.3 | 0.0 | 76.8 | 8.7 |

In Examples 6-10, the results of which are summarized in Table 2, the flow rate of the argon carrier gas was set at 100 sccm, the flow rate of $H_2$ gas at 2000 sccm, and the tungsten CVD deposition time for 600 seconds. From the data in Table 2, it can be observed that the $WOCl_4$ etched titanium nitride under most of the conditions tested. It can also be observed that the rate/extent of titanium nitride etching increased for higher $T_{sub}$, while tungsten deposition only occurred at 650° C., at the lower precursor concentration.

TABLE 3a (With $H_2$ only)

| Example | Stage Temp. (° C.) | Precursor chamber pressure (Torr) | Pre Buffer Thickness (Å) | Post Buffer Thickness (Å) | W Thickness (Å) | $Al_2O_3$ etched (Å) |
|---|---|---|---|---|---|---|
| 11 | 693 | 80 | 40.02 | 22.25 | 0.0 | 17.8 |
| 12 | 414 | 80 | 40.36 | 39.09 | 0.0 | 1.3 |
| 13 | 578 | 30 | 40.38 | 35.34 | 0.0 | 5.0 |
| 14 | 693 | 10 | 40.32 | 31.10 | 0.0 | 9.2 |
| 15 | 414 | 10 | 39.96 | 39.38 | 0.0 | 0.6 |

TABLE 3b (With argon only)

| Example | Stage Temp. (° C.) | Precursor chamber pressure (Torr) | Pre Buffer Thickness (Å) | Post Buffer Thickness (Å) | W Thickness (Å) | $Al_2O_3$ etched (Å) |
|---|---|---|---|---|---|---|
| 16 | 693 | 80 | 39.09 | 30.09 | 0 | 9.0 |
| 17 | 414 | 80 | 38.85 | 37.90 | 0.0 | 1.0 |
| 18 | 578 | 30 | 39.13 | 36.99 | 0.0 | 2.1 |
| 19 | 693 | 10 | 39.26 | 35.12 | 0.0 | 4.1 |
| 20 | 414 | 10 | 39.35 | 38.15 | 0.0 | 1.2 |

In Examples 11-20, the results of which are summarized in Tables 3a and 3b, the argon carrier gas was utilized at a 100 sccm; otherwise, in Table 3a, $H_2$ gas was introduced at a rate of 2000 sccm (with no additional argon gas). In Table 3b, argon purge gas was introduced at a rate of 2000 sccm in addition to argon carrier gas at a rate of 100 sccm (with no additional $H_2$ gas). In general, $Al_2O_3$ etches at a slower rate in Ar than when using $H_2$ co reactant gas flow. This data may also shows that $Al_2O_3$ was etched more quickly in argon than with $H_2$ at low substrate temperature conditions combined with low chamber pressure (higher $WOCl_4$ concentration).

TABLE 4

| Example | Stage Temp. (° C.) | Precursor chamber pressure (Torr) | Pre Buffer Thickness (Å) | Post Buffer Thickness (Å) | W Thickness (Å) | Pre Process Resistance (ohm/sq) | $SiO_2$ etched (Å) |
|---|---|---|---|---|---|---|---|
| 21 | 693 | 80 | 4300 | 11.39 | 690.04 | 100000 | * |
| 22 | 414 | 80 | 4268 | 11.05 | 0.0 | 100000 | 1.0 |
| 23 | 578 | 30 | 4290 | 0.03 | 0.0 | 100000 | 0.0 |
| 24 | 693 | 10 | 4334 | 0 | 0.0 | 100000 | 0.0 |
| 25 | 414 | 10 | 4308 | 6.3 | 0.0 | 100000 | 0.0 |

*unknown

Examples 21 to 25 relate to attempts to etch $SiO_2$. The results are summarized in Table 4. In these experiments, argon carrier gas was utilized at 100 sccm, and $H_2$ gas was utilized at 2000 sccm. Tungsten deposition only occurred at 650° C. at lower precursor concentration. Resistivity was approximately 18$\mu\Omega$-cm. No $SiO_2$ etching was observed for [$WOCl_4$]<1000 ppm at any temperature. Not wishing to be bound by theory, based on the mechanics of the etching process, it is believed that etching of $SiO_2$ may occur slowly in some examples at higher concentrations of the $WOCl_4$ precursor.

TABLE 5

| Ex. | Stage Temp. (° C.) | W dep Exposure (cycles) | Pre Buffer Thickness | Post Buffer Thickness | W Thickness (Å) | TiN etched (Å) | TiN etch Rate (Å/cycle) | Tsub (° C.) | W Deposition Rate (Å/cycle) |
|---|---|---|---|---|---|---|---|---|---|
| 26 | 450 | 1  | 15.12 | 11.18 | 0.0  | 3.94 | 3.94  | 430 | 0.0  |
| 27 | 450 | 5  | 14.60 | 10.32 | 0.0  | 4.28 | 0.856 | 430 | 0.0  |
| 28 | 450 | 10 | 15.04 | 9.62  | 0.0  | 5.42 | 0.542 | 430 | 0.0  |
| 29 | 450 | 15 | 14.76 | 10.42 | 2.4  | 4.34 | 0.289 | 430 | 0.16 |
| 30 | 450 | 25 | 15.44 | 9.63  | 18.3 | 5.81 | 0.232 | 430 | 0.73 |
| 31 | 500 | 1  | 14.74 | 11.07 | 0.0  | 3.67 | 3.670 | 475 | 0.00 |
| 32 | 500 | 5  | 14.48 | 9.90  | 0.0  | 4.58 | 0.916 | 475 | 0.00 |
| 33 | 500 | 10 | 14.50 | 9.65  | 9.1  | 4.85 | 0.485 | 475 | 0.91 |
| 34 | 500 | 16 | 15.19 | 9.84  | 26.2 | 5.35 | 0.334 | 475 | 1.64 |

In examples 26 through 34, the results of which are shown in Table 5 above, a titanium nitride substrate was subjected to pulsed CVD conditions, utilizing a precursor chamber pressure of 80 Torr, argon carrier gas at 100 sccm, $H_2$ gas at 2000 sccm (continuous). The pulsing of $WOCl_4$ precursor was for 1 second in 40 second cycle intervals. The number of pulse cycles for the $WOCl_4$ precursor was 1, 5, 10, 15, and 25 cycles, respectively. This data shows that titanium nitride etch rate in this pulsed CVD process is substantial in the first cycle and drops off dramatically for >5 cycles. As the number of cycles is increased beyond 10 cycles, tungsten deposition begins to occur. Additionally, lower substrate temperature (430° C.) increased the titanium nitride etch rate by about 10 percent for the first cycle.

TABLE 6

| Ex. | Stage Temp (° C.) | W dep (cycles) | Pre-Buffer Thickness | Post-Buffer Thickness | W Film Thickness (Å) | TiN etch (Å) | TiN etch Rate (Å/cycle) | Tsub (° C.) | W Deposition Rate (Å/cycle) | Precursor On-Time (s) |
|---|---|---|---|---|---|---|---|---|---|---|
| 35 | 500 | 16 | 15.19 | 9.84 | 26.2  | 5.35 | 0.334 | 475 | 1.64  | 1  |
| 36 | 500 | 15 | 14.53 | 8.33 | 30.2  | 6.20 | 0.413 | 475 | 2.01  | 5  |
| 37 | 500 | 15 | 14.36 | 7.67 | 169.9 | 6.69 | 0.446 | 475 | 11.33 | 10 |

In experiments 35 through 37, the results of which are summarized in Table 6, the data was generated using pulsed chemical vapor deposition conditions utilizing $WOCl_4$ as precursor, including a precursor chamber pressure of 80 Torr, and an argon carrier gas rate of 100 sccm. In examples 35-37, $H_2$ gas was injected to the reactor chamber at a constant rate of 2000 sccm. In examples 35 through 37, increasing the $WOCl_4$ precursor "on-time" increased the titanium nitride etch rate 30 percent for 10 second on-time. Additionally, the tungsten deposition rate increases with on-time for 15 cycles runs. NOTE: the increased loss of TiN could be due to loss of x-ray signal through the tungsten film.

The examples in Table 7 represent the etching of a titanium nitride substrate under CVD conditions utilizing an Argon carrier gas at 100 sccm, $H_2$ at 2000 sccm (continuous), and tungsten deposition of 600, 600, 300, 300, and 300 s, respectively. This data illustrates that increasing precursor ($WOCl_4$) concentration increases etch rate; precursor concentration can be increased by decreasing chamber pressure, decreasing the co-reactant reducing gas and/or increasing the ampoule temperature.

TABLE 7

| Ex. | Stage Temp. (° C.) | Ampoule temp (° C.) | Pre Buffer Thickness | Post Buffer Thickness | Precursor chamber pressure (Torr) | TiN etched (Å) | TiN etch Rate (Å/min) | Tsub (° C.) | Etch time (s) |
|---|---|---|---|---|---|---|---|---|---|
| 38 | 578 | 90  | 14.9 | 0.03 | 30 | 14.9  | 1.488 | 550 | 600 |
| 39 | 578 | 100 | 14.9 | 0.16 | 10 | 14.71 | 2.942 | 550 | 300 |
| 40 | 450 | 100 | 15.2 | 0.34 | 10 | 14.84 | 2.968 | 430 | 300 |
| 41 | 450 | 90  | 15.0 | 2.88 | 10 | 12.09 | 2.418 | 430 | 300 |

TABLE 8a

| Ex. | Stage Temp. (° C.) | Argon carrier (sccm) | Pre Buffer Thickness (Å) | Post Buffer Thickness (Å) | TiN etched (Å) | TiN etch Rate (Å/min) | Tsub (° C.) |
|---|---|---|---|---|---|---|---|
| 42 | 578 | 100 | 14.9 | 0.16 | 14.71 | 2.942 | 550 |
| 43 | 500 | 100 | 14.7 | 0    | 14.70 | 2.940 | 465 |
| 44 | 450 | 100 | 15.2 | 0.34 | 14.84 | 2.968 | 430 |

TABLE 8b

| Ex. | Stage Temp. (° C.) | Argon carrier (sccm) | Pre Buffer Thickness (Å) | Post Buffer Thickness (Å) | TiN etched (Å) | TiN etch Rate (Å/min) | Tsub (° C.) |
|---|---|---|---|---|---|---|---|
| 45 | 450 | 100 | 15.2 | 0.34 | 14.84 | 2.968 | 430 |
| 46 | 450 | 50 | 15.4 | 1.99 | 13.44 | 2.688 | 430 |
| 47 | 450 | 25 | 15.1 | 3.79 | 11.34 | 2.268 | 430 |

In each of examples 42 through 47, the data of which is summarized in Tables 8a and 8b, the precursor was $WOCl_4$, the $H_2$ gas flow rate was 2000 sccm, the tungsten deposition time was 300 s, chamber pressure was 10 Torr and the resulting tungsten thickness was 0.0 Å. The data in Table 8a shows that the titanium nitride etch rate did not change with $T_{sub}$ due to the reaction proceeding in a mass transport limited regime at a pressure of 10 Torr. Table 8b shows that increasing the precursor carrier gas increases the precursor concentration and titanium nitride etch rate, thus showing that etching was mass transport rate limited at 430° C. Additionally, titanium nitride etching was mass transport limited at a pressure of 10 Torr and surface reaction rate limited at a pressure of 80 Torr.

TABLE 9

| Example | Pressure (Torr) | Tungsten Thickness (Å) | TiN Etched (Å) | Tungsten Deposition Rate (Å/cycle) | TiN Etch Rate (Å/cycle) | Tungsten Resistivity (µΩ-cm) |
|---|---|---|---|---|---|---|
| 48 | 80 | 43.8 | 3.95 | 0.73 | 0.07 | 60.9 |
| 49 | 40 | 48.9 | 6.48 | 0.82 | 0.11 | 60.1 |
| 50 | 20 | 29.2 | 6.40 | 0.49 | 0.11 | 92.8 |

In each of examples 48 through 50 (ALE process), the data of which is summarized in Table 9, the precursor was $WOCl_4$, Ar carrier gas flow rate was 200 sccm, the $H_2$ gas flow rate was 2000 sccm, the Argon purge gas flow rate was 500 sccm, the tungsten deposition time was 60 cycles, and the substrate temperature was 520° C. This data shows that the tungsten deposition rate on titanium nitride decreases with decrease in pressure (from 80 Torr to 20 Torr) (i.e., increase in $WOCl_4$ concentration). Additionally, the TiN etch rate increases with a decrease in pressure; however, 40 Torr may be indicative of a transition between deposition and etching. The resistivity was very good for thin tungsten films deposited under these process conditions. This data also illustrates that substrate etching and deposition can occur without changing experimental conditions and may be competitive in real time.

TABLE 10

| Example | Precursor On-time (s) | Tungsten Thickness (Å) | TiN Etched (Å/cycle) | Tungsten Deposition Rate (Å/cycle) | TiN Etch Rate (Å/cycle) | Tungsten Resistivity (µΩ-cm) |
|---|---|---|---|---|---|---|
| 51 | 1 | 15.6 | 4.41 | 0.26 | 0.07 | 71.3 |
| 52 | 2 | 23.0 | 6.08 | 0.38 | 0.10 | 76.3 |

In each of examples 51 through 52, the data of which is summarized in Table 10, the precursor was $WOCl_4$, argon carrier gas flow rate was 200 sccm, the $H_2$ gas flow rate was 2000 sccm, the argon purge gas flow rate was 500 sccm, the tungsten deposition time was 60 cycles, pressure was 20 Torr and the substrate temperature was 520° C. This data demonstrates that increasing the $WOCl_4$ "on-time" increases both the tungsten deposition rate and titanium nitride etch rate for titanium nitride substrates. The tungsten resistivity showed little variation under these process conditions.

TABLE 11

| Example | Deposition Time (cycles) | Tungsten Thickness (Å) | TiN Etched (Å/cycle) | Tungsten Deposition Rate (Å/cycle) | TiN Etch Rate (Å/cycle) | Tungsten Resistivity (µΩ-cm) |
|---|---|---|---|---|---|---|
| 53 | 30 | 2.4 | 3.78 | 0.08 | 0.13 | — |
| 54 | 60 | 22.9 | 4.44 | 0.38 | 0.07 | 71.3 |

In examples 53 and 54, the data of which is summarized in Table 11, the precursor was $WOCl_4$, Ar carrier gas flow rate was 200 sccm, the $H_2$ gas flow rate was 2000 sccm, the Argon purge gas flow rate was 500 sccm, pressure was 20 Torr and the substrate temperature was 520° C. This data shows that there is about a 30 cycle nucleation delay to deposit a layer of tungsten on titanium nitride. Additionally, the deposition rate is increasing with the number of cycles after the surface is covered with tungsten. The etch rate decreases with time, also as the surface is increasingly covered with tungsten. The observed tungsten resistivity was good for these thin tungsten films.

TABLE 12

| Example | Pressure (Torr) | Tungsten Thickness (Å) | Tungsten Deposition Rate (Å/cycle) | $Al_2O_3$ Etched (Å) | $Al_2O_3$ Etch Rate (Å/cycle) | Tungsten Resistivity (µΩ-cm) |
|---|---|---|---|---|---|---|
| 55 | 80 | 223.7 | 5.59 | 15.39 | 0.38 | 20.0 |
| 56 | 70 | 87.0 | 2.90 | 11.48 | 0.38 | 68.3 |
| 57 | 60 | 36.3 | 1.21 | 14.44 | 0.48 | — |

In each of examples 55 through 57, the data of which is summarized in Table 12, the precursor was $WOCl_4$, Ar carrier gas flow rate was 200 sccm, the $H_2$ gas flow rate was 1000 sccm, the Argon purge gas flow rate was 500 sccm and the $Al_2O_3$ substrate temperature was 650° C. Example 55 was run for 40 cycles and examples 56 and 57 were run for 30 cycles. This data shows the tungsten deposition rate decreases with a decrease in pressure while the $Al_2O_3$ etch rate increases. As might be expected, the resistivity increases for thinner tungsten films, a result of incomplete coverage and non-optimized morphology.

TABLE 13

| Ex. | Argon Carrier Gas Flow (sscm) | Argon Purge Gas Flow (sscm) | Deposition time (cycles) | Tungsten Thickness (Å) | Tungsten Deposition Rate (Å/cycle) | $Al_2O_3$ Etched (Å) | $Al_2O_3$ Etch Rate (Å/Cycle) | Tungsten Resistivity (µΩ-cm) |
|---|---|---|---|---|---|---|---|---|
| 58 | 100 | 500 | 40 | 175.0 | 4.38 | 9.49 | 0.24 | 23.4 |
| 59 | 50 | 500 | 40 | 103.9 | 2.60 | 7.03 | 0.18 | 50.7 |
| 60 | 50 | 700 | 60 | 116.2 | 1.94 | 9.61 | 0.16 | 58.5 |

In each of examples 58 through 60, the data of which is summarized in Table 13, the precursor was $WOCl_4$, the $H_2$ gas flow rate was 1000 sccm, and the $Al_2O_3$ substrate temperature was 650° C. This data shows that both the tungsten deposition rate and $Al_2O_3$ etch rate decreases with lower argon carrier gas flows and increased argon purge gas flows. The resistivity varied from about 23 to 59 µΩ-cm.

TABLE 14

| Example | Deposition Time (cycles) | Tungsten Thickness (Å) | Tungsten Deposition Rate (Å/Cycle) | Al$_2$O$_3$ Etched (Å) | Al$_2$O$_3$ Etch Rate (Å/cycle) | Tungsten Resistivity (μΩ-cm) |
|---|---|---|---|---|---|---|
| 61 | 40 | 28.9 | 0.72 | 7.53 | 0.19 | — |
| 62 | 60 | 105.5 | 1.76 | 13.42 | 0.22 | 69.6 |
| 63 | 60 | 214.0 | 2.68 | 13.37 | 0.17 | 25.5 |

In each of examples 61 through 63, the data of which is summarized in Table 14, the precursor was WOCl$_4$, Ar carrier gas flow rate was 50 sccm, the H$_2$ gas flow rate was 1000 sccm, the Argon purge gas flow rate was 700 sccm and the Al$_2$O$_3$ substrate temperature was 650° C. This data shows that the tungsten deposition rate increases with the number of cycles as the Al$_2$O$_3$ surface becomes increasingly covered with tungsten. There is also an increase in the Al$_2$O$_3$ etch rate, but that may be due to x-ray absorption by the tungsten film on top of the Al$_2$O$_3$. The resistivity decreases with increased tungsten film thickness, as expected, due to reduction in pinholes or voids in the thin tungsten films.

Adhesion test ASTM D 3359-02 results showed excellent adhesion, i.e., no delamination from the substrate for 132 Å film on titanium nitride substrate and 100 Å tungsten film on alumina substrate deposited at 650° C.

Referring to the attached drawings and the experimental data set forth above, FIG. 1 is a plot of Al$_2$O$_3$ etch rate (Å/minute) versus Substrate Temperature (° C.). This data illustrates that the Al$_2$O$_3$ etch rate is about double when co-reacting with H$_2$ as compared to reacting with Argon only. Additionally, the etch rate decreased with a decrease in pressure. Lower pressures increase the concentration of WOCl$_4$ which should increase etching. This data indicates that the deposition is increasing with substrate temperature and thus reaction rate limited and also that residence time is dominating the etch rate. (See Table 1.)

Figure 2:
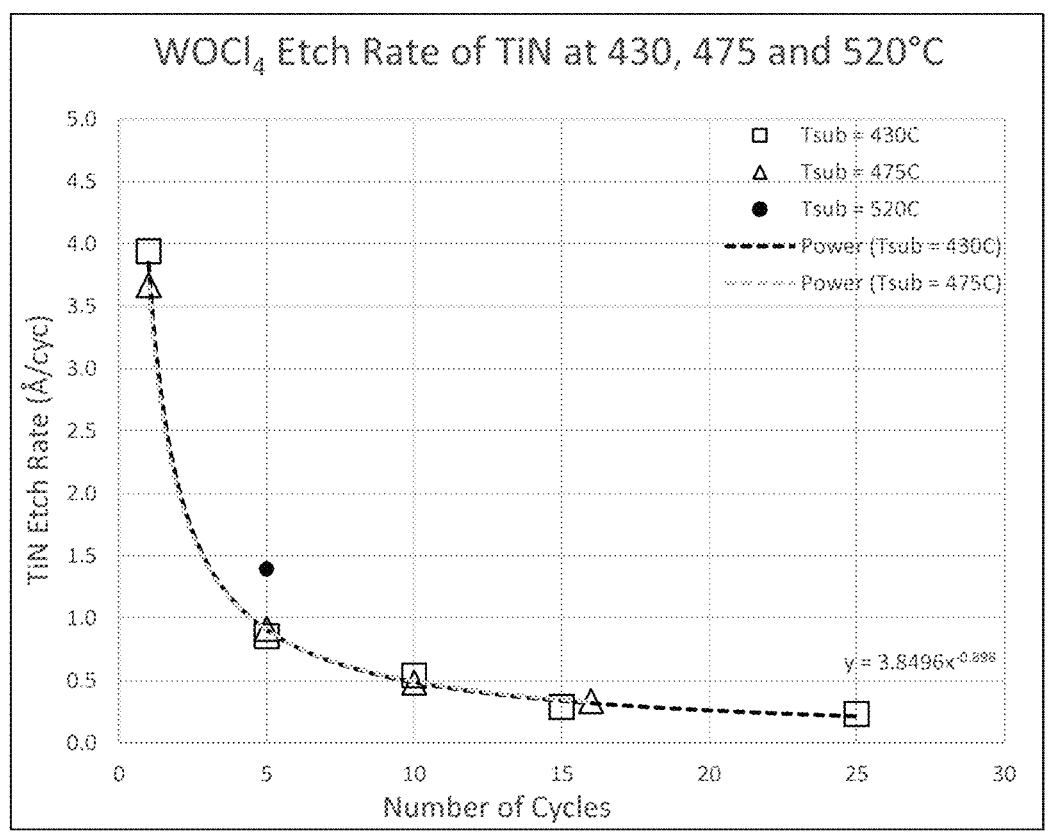
FIG. 2 is a plot of the etch rate of TiN at temperatures of 430, 475, and 520° C. The TiN etch rate (Å/cycle) is plotted versus number of cycles in a pulsed chemical vapor etching (pulsed CVE) process.

FIG. 2 is a plot of the etch rate of TiN at temperatures of 430, 475, and 520° C. The TiN etch rate (Å/cycle) is plotted versus number of cycles. See also the data provided in Tables 1 and 2. This data was generated using pulsed chemical vapor deposition conditions of 80 Torr pressure, 100 sccm of Ar carrier gas, and H$_2$ flow of 2000 sccm co-reactant for 1 second WOCl$_4$ pulse for a 40 second total cycle time. The data of substrate temperatures of 430 and 475° C. illustrate operation in a mass transfer rate limited process since the etch rate does not increase with substrate temperature. Additionally, the amount of etching is limited with the largest portion of etching occurring in the first cycle and diminishing over the next 5 cycles.

Figure 3:
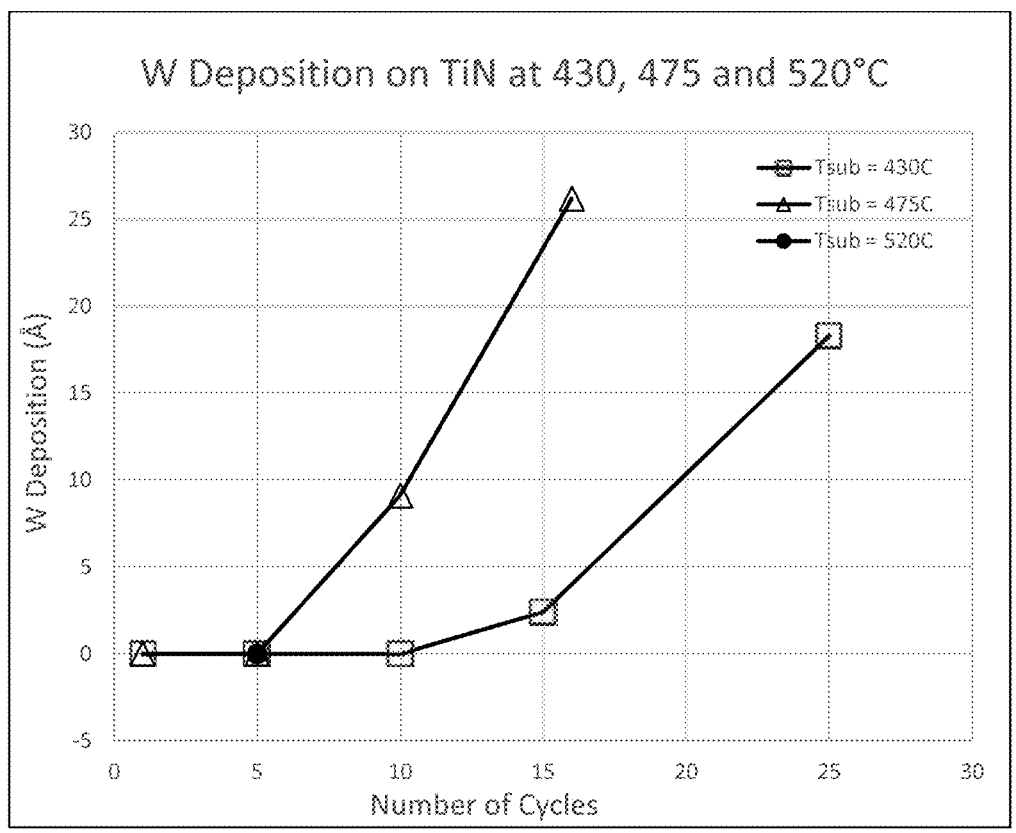
FIG. 3 is a plot of Tungsten deposition on TiN at temperatures of 430, 475, and 520° C., using $WOCl_4$ as precursor. This data was generated using pulsed chemical vapor deposition conditions of 80 Torr pressure, 100 sccm of Argon carrier gas, and $H_2$ flow of 2000 sccm. Tungsten deposition in Å is plotted versus the number of cycles.

FIG. 3 is a plot of Tungsten deposition on TiN at temperatures of 430, 475, and 520° C., using WOCl$_4$ as precursor. This data was generated using pulsed chemical vapor deposition conditions of 80 Torr pressure, 100 sccm of Argon carrier gas, and H$_2$ flow of 2000 sccm. Tungsten deposition (Å) is plotted versus the number of cycles. This data illustrates that tungsten deposition occurs after 5 cycles for the 475° C. and 520° C. operating temperatures but requires more time (after 10 cycles) for 430° C. operating temperature, indicating a substrate temperature dependent nucleation delay.

Figure 4:
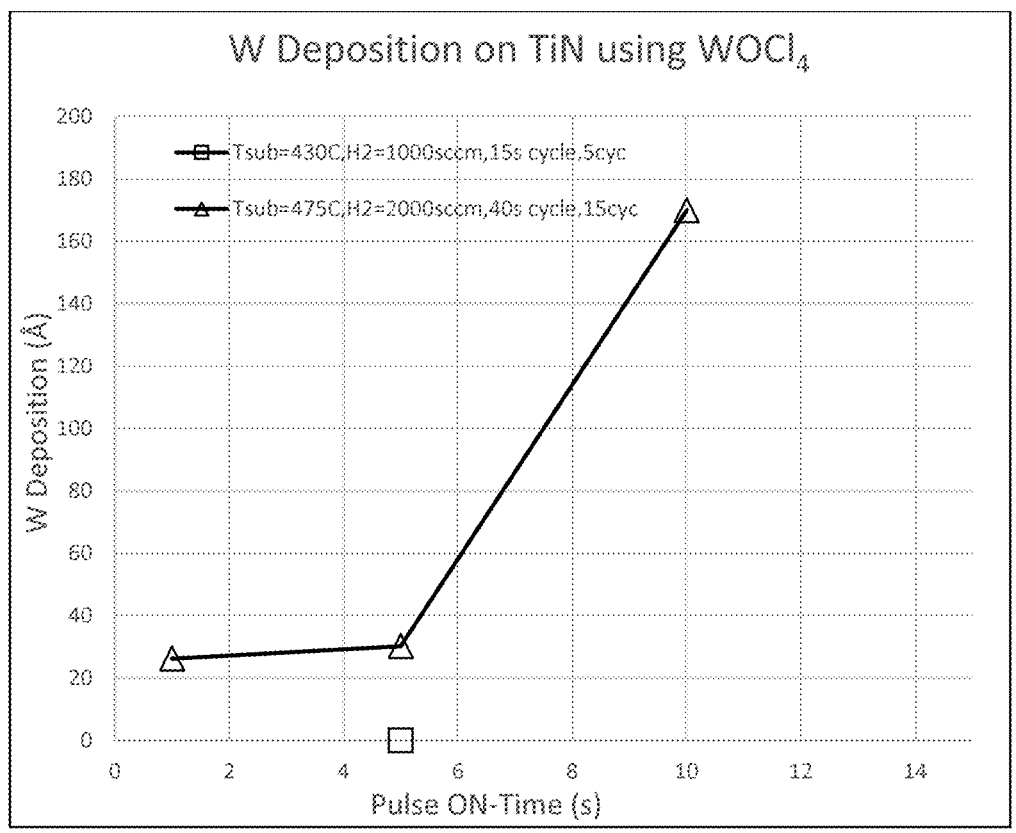
FIG. 4 illustrates the pulsed chemical vapor deposition (pulsed CVD) of tungsten on titanium nitride using $WOCl_4$ as precursor. Tungsten deposition in A was plotted versus pulse "on-time" in seconds for the precursor.

FIG. 4 illustrates the pulsed CVD deposition of tungsten on titanium nitride using WOCl$_4$ as precursor. Tungsten deposition in Å was plotted versus pulse "on-time" in seconds for the precursor. This data illustrates that tungsten deposition increased significantly (~6x) for 10 seconds on-time of the precursor. The pulsed CVD conditions included 80 Torr pressure, Argon carrier at 100 sccm, H$_2$ flow (continuous) of 2000 sccm. Under these conditions and with a substrate temperature (T$_{sub}$) of 430° C., tungsten deposition was not observed, but titanium nitride films etching was observed. (See Table 6)

Figure 5:
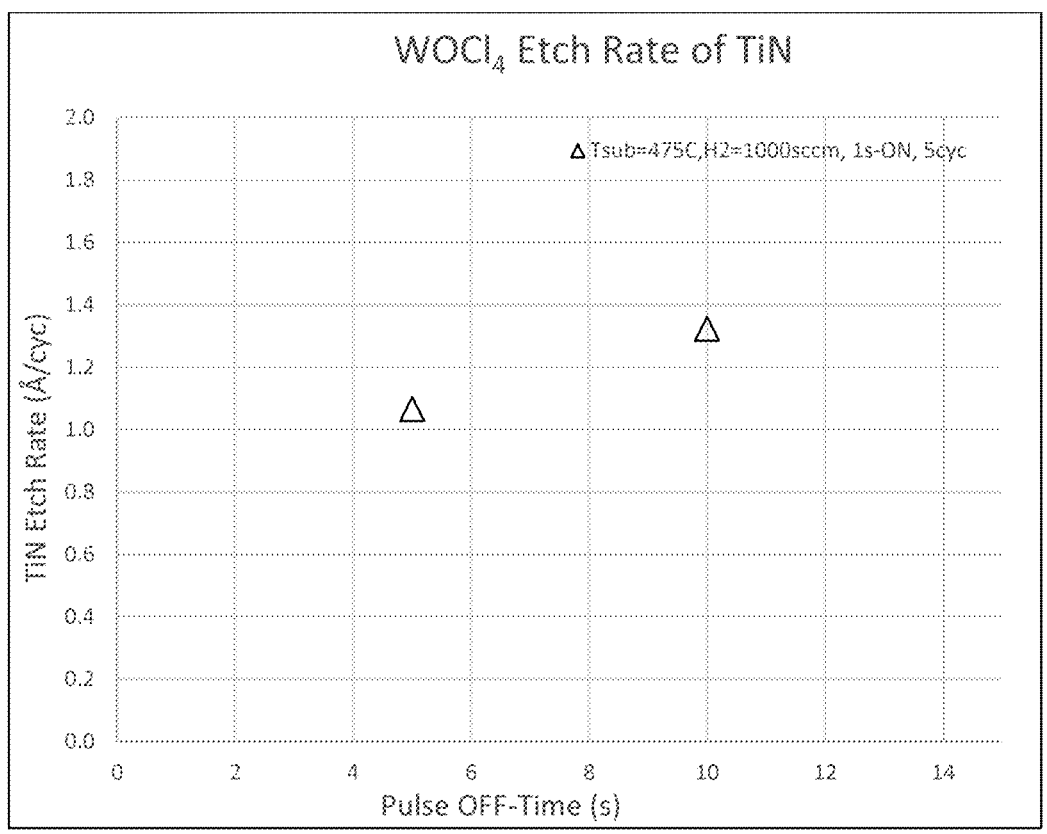
FIG. 5 illustrates the effect of pulse "off-time" for the exposure of a titanium nitride substrate to pulsed CVD conditions using $WOCl_4$ as the precursor. Other conditions included 80 Torr pressure, Argon carrier gas at 100 sccm and continuous $H_2$ flow of 1000 sccm. Titanium nitride etch rate is plotted versus pulse "off-time".

FIG. 5 illustrates the effect of pulse "off-time" for the exposure of a titanium nitride substrate to pulsed CVD conditions using WOCl$_4$ as precursor. Other conditions included 80 Torr pressure, Argon carrier gas at 100 sccm and continuous H$_2$ flow of 1000 sccm. Titanium nitride etch rate is plotted versus pulse "off-time". As the off-time is increased, ampoule temperature increases due to decreased cooling from less Ar flow through the ampoule and thus, the precursor concentration increases. This plot also illustrates that titanium nitride etch rate is directly dependent on WOCl$_4$ precursor concentration; additionally, no tungsten was deposited in this instance due to short exposure (5 cycles).

Figure 6:
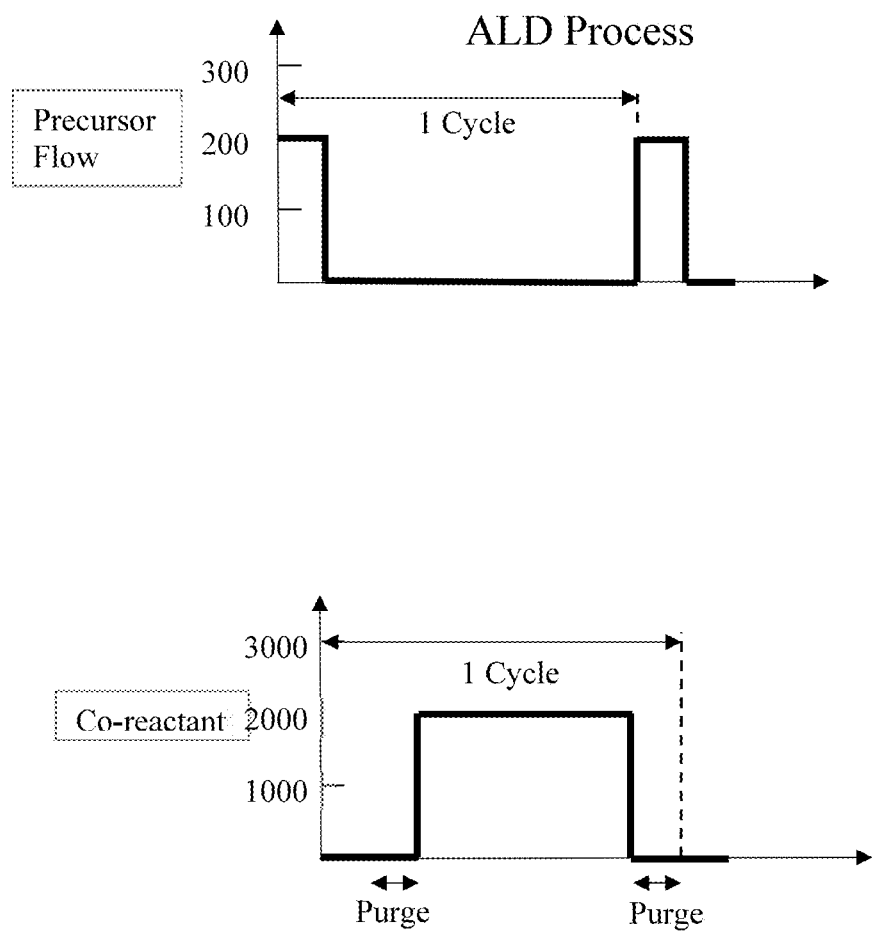
FIG. 6 is a simplified depiction of an atomic layer deposition (ALD) process for practicing the method of the disclosure.

FIG. 6 is a simplified depiction of an "ALD" (or "ALE" in the case of etching) process for practicing the method of the disclosure. The WOCl$_4$ and co-reactant (i.e., reducing gas) are pulsed "on" for a fraction of the cycle time. Vacuum or inert gas purge occurs between precursor and co-reactant pulses. The cycle is repeated for a number of times necessary to produce a specific film thickness (or achieve the desired amount of etching.)

Figure 7:
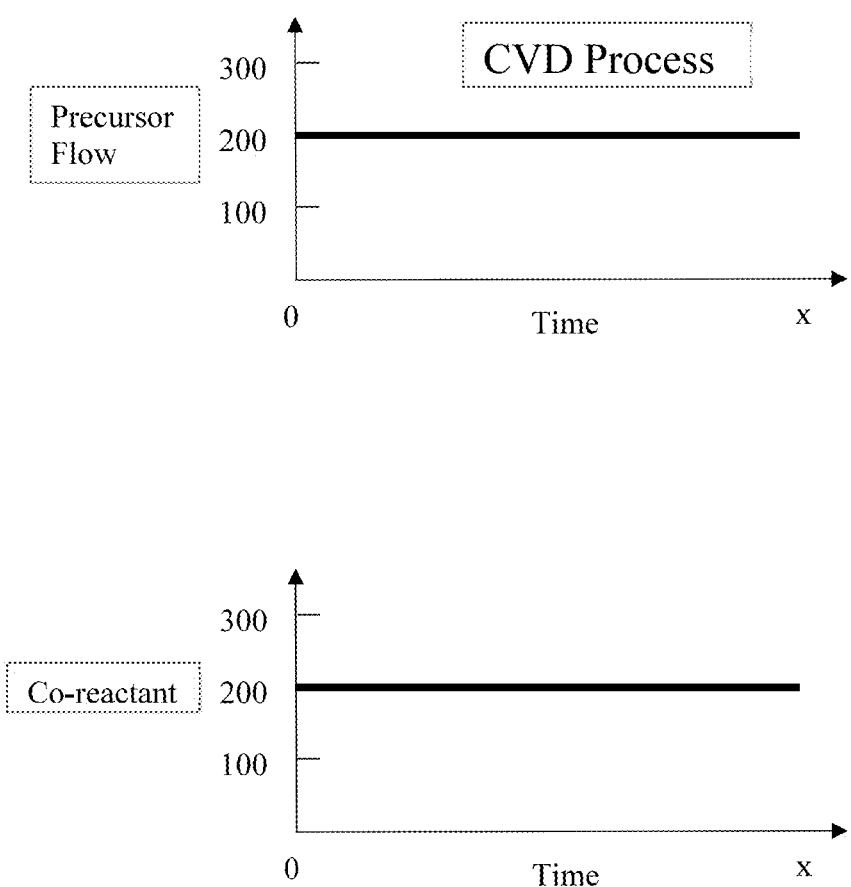
FIG. 7 is a simplified depiction of a chemical vapor deposition (CVD) process for practicing the method of the disclosure.

FIG. 7 is a simplified depiction of a "CVD" (or "CVE" in the case of etching") process for practicing the method of the disclosure. The WOCl$_4$ and co-reactant are both continuously fed into the reaction zone until a desired amount of deposition (or etching) has occurred.

Figure 8:
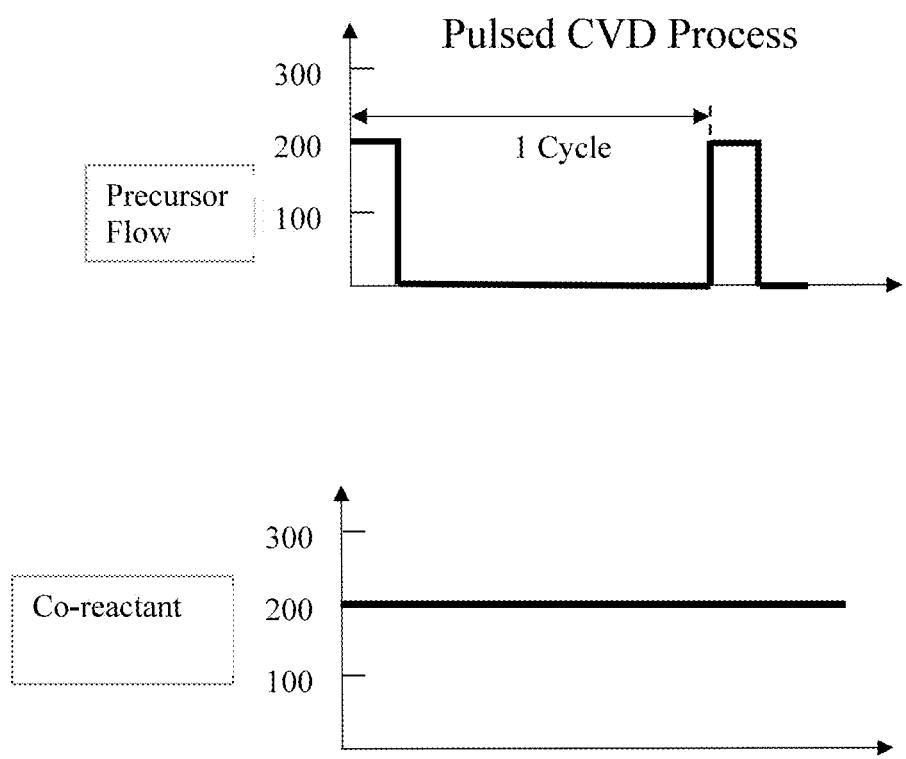
FIG. 8 is a simplified depiction of a "Pulsed CVD" process for practicing the method of the disclosure.

FIG. 8 is a simplified depiction of a "Pulsed CVD" (or "CVE" in the case of etching") process for practicing the method of the disclosure. The WOCl$_4$ precursor is injected into the reaction zone in pulses for a given period of time, followed by "off" periods, while the co-reactant is continuously fed into the reaction zone. In this fashion, the co-reactant necessarily purges the precursor from the reaction zone during these periods when the pulsing is "off".

FIG. 9 is a simplified depiction of a suitable reaction chamber for carrying out the process of the disclosure.

Other aspects of the disclosure include the following:

Aspect 1 is a method comprising exposing a substrate to WOCl$_4$ and a reducing gas in a reaction zone under:
  (a) a first set of process conditions to controllably etch a substrate, wherein the substrate comprises a film chosen from Al$_2$O$_3$, TiN, HfO$_2$, ZrO$_2$, W, Mo, Co, Ru, Ir, Cu, SiO$_2$ and SiN films;
  (b) a second set of process conditions to controllably deposit tungsten onto the surface of a substrate, wherein the substrate comprises a film chosen from Al$_2$O$_3$, HfO$_2$, ZrO$_2$, W, Mo, Co, Ru, Ir, Cu, SiN, TiN, and SiO$_2$ films; or
  (c) a third set of process conditions to selectively deposit tungsten onto metal conducting W, Mo, Co, Ru, Ir, Cu, substrates, but not onto neighboring nitride or dielectric oxide films.

Aspect 2 is the method of aspect 1, wherein the first set of process conditions comprise a substrate temperature range of about 200° C. to about 1000° C., a WOCl$_4$ concentration of about 800 ppm to about 20,000 ppm, and pressure of about 0.5 to about 500 Torr.

Aspect 3 is the method of aspect 1, wherein the second set of process conditions comprise a substrate temperature range of about 200° C. to about 1000° C., a WOCl$_4$ concentration of about 5 ppm to about 1200 ppm, and pressure of about 0.5 to about 500 Torr.

Aspect 4 is the method of aspect 1, wherein the reducing gas is chosen from hydrogen, hydrazine, or an alkylated hydrazine.

Aspect 5 is the method of aspects 2 or 3, wherein the reducing gas is hydrogen, and the hydrogen is fed into the reaction zone at a rate of about 0.1 to about 10 liters per minute.

Aspect 6 is a method comprising exposing a substrate comprising a film chosen from $Al_2O_3$, TiN, $HfO_2$, $ZrO_2$, W, Mo, Co, Ru, and SiN films, to (i) $WOCl_4$ along with a carrier gas delivered from a precursor ampoule, and (ii) a reducing gas, in a reaction zone, wherein the pressure in the reaction zone is about 0.5 to 500 Torr; the substrate temperature is about 200° C. to 1000° C., the reducing gas flow rate is about 0.1 to 10 liters per minute, the carrier gas flow is from about 0.001 to 1 liters per minute, the concentration of $WOCl_4$ in the reaction zone is greater than 1000 ppm, and the precursor ampoule temperature is about 10° C. to about 180° C., whereby the substrate comprising a film chosen from $Al_2O_3$, TiN, $HfO_2$, $ZrO_2$, W, Mo, Co, Ru, and SiN films is etched.

Aspect 7 is the method of aspect 6, wherein the concentration of $WOCl_4$ in the reaction zone is about 1000 ppm to about 10,000 ppm.

Aspect 8 is the method of aspect 6, wherein said substrate is exposed to a continuous flow of $WOCl_4$ precursor and reducing gas.

Aspect 9 is the method of aspect 6, wherein said substrate is exposed to a continuous flow of reducing gas, while $WOCl_4$ precursor is pulsed into the reaction zone for predetermined periods of time.

Aspect 10 is the method of aspect 9, wherein the $WOCl_4$ precursor is pulsed into the reaction zone for a period of 0.05 to about 20 seconds, followed by an off period of 0.05 to about 120, and repeated for a desired number of pulses until a desired amount of etching has occurred on the substrate.

Aspect 11 is the method of aspect 9, wherein the $WOCl_4$ precursor is pulsed into the reaction zone for a period of 0.1 to about 10 seconds, followed by an off period of 1 to about 60.

Aspect 12 is the method of aspect 9, wherein the substrate is an $Al_2O_3$ film.

Aspect 13, is the method of aspect 6, wherein said substrate is sequentially
(i) exposed to $WOCl_4$ precursor, followed by
(ii) purging by vacuum or an inert gas, followed by
(iii) exposure to a reducing gas, followed by
(iv) purging by vacuum or an inert gas and repeating the sequence of (i) through (iv), until a desired amount of etching on the substrate has occurred.

Aspect 14 is the method of aspect 6, wherein the concentration of $WOCl_4$ precursor in the reaction zone is about 2000 ppm to about 5000 ppm.

Aspect 15 is the method of aspect 6, wherein the substrate temperature is about 300° C. to about 450° C.

Aspect 16 is a method comprising exposing a substrate comprising a film chosen from $Al_2O_3$, $HfO_2$, $ZrO_2$, W, Mo, Co, Ru, SiN, TiN, and $SiO_2$ films, to
(i) $WOCl_4$ along with a carrier gas delivered from a precursor ampoule, and
(ii) a reducing gas, in a reaction zone,
wherein the pressure in the reaction zone is about 0.5 Torr to 500 Torr; the substrate temperature is about 200° C. to 1000° C., the reducing gas flow rate is about 0.1 to 10 liters per minute, the carrier gas flow is from about 0.001 to 1 liters per minute, the concentration of $WOCl_4$ is less than 1000 ppm, and the precursor ampoule temperature is about 10° C. to about 180° C., whereby tungsten is deposited onto the surface of the substrate comprising a film chosen from $Al_2O_3$, $HfO_2$, $ZrO_2$, W, Mo, Co, Ru, SiN, TiN, and $SiO_2$ films.

Aspect 17 is the method of aspect 16, wherein the concentration of $WOCl_4$ in the reaction zone is about 75 ppm to about 1000 ppm.

Aspect 18 is the method of aspect 16, wherein, said substrate is sequentially
(i) exposed to $WOCl_4$ precursor, followed by
(ii) purging by vacuum or an inert gas, followed by
(iii) exposure to a reducing gas, followed by
(iv) purging by vacuum or an inert gas, and repeating the sequence of (i) through (iv), until a desired amount of deposition of Tungsten on the substrate has occurred.

Aspect 19 is the method of aspect 16, wherein said exposure is, wherein said substrate is exposed to a continuous flow of $WOCl_4$ precursor and reducing gas.

Aspect 20 is the method of aspect 16, wherein said exposure is wherein said substrate is exposed to a continuous flow of reducing gas, while $WOCl_4$ precursor is pulsed into the reaction zone for predetermined periods of time.

Aspect 21 is the method of aspect 20, wherein the $WOCl_4$ precursor is pulsed into the reaction zone for a period of 0.1 to about 10 seconds, followed by an off period of 1 to about 60 seconds, and repeated for a desired number of pulses until a desired amount of Tungsten deposition has occurred on the substrate.

Aspect 22 is the method of aspect 16, wherein the concentration of $WOCl_4$ precursor in the reaction zone is about 100 ppm to about 800 ppm.

Aspect 23 is the method of aspect 16, wherein the substrate temperature is about 550° C. to about 700° C.

Aspect 24 is a method of selectively depositing tungsten onto a metal conductor film comprising exposing a substrate including a film selected from $Al_2O_3$, $HfO_2$, $ZrO_2$, W, Mo, Co, Ru, Cu, Ir, SiN, TiN, and $SiO_2$ films, to (i) $WOCl_4$ along with a carrier gas delivered from a precursor ampoule, and (ii) a co-reactant reducing gas, in a reaction zone, under processing conditions including a pressure in the reaction zone of about 0.5 Torr to 500 Torr; a substrate temperature of about 200° C. to 1000° C.; a reducing gas flow rate of about 0.1 to 10 liters per minute; a carrier gas flow of from about 0.001 to 1 liters per minute; a concentration of [$WOCl_4$] of less 1000 ppm, wherein the precursor ampoule temperature is about 10° C. to about 180° C., and
wherein tungsten is selectively deposited onto a metal conductor film, such as W, Mo, Co, Ru, Cu, Ir and other suitable metal conductor films, but not deposited onto a nitride and/or a dielectric oxide film.

Aspect 25 is a tungsten film having a thickness of about 10 Å to about 50 Å, and having a resistivity of about 100 to about 50 μΩ-cm, respectively.

Aspect 26 is a tungsten film having a thickness of about 50 Å to about 200 Å, and having a resistivity of about 50 to about 13 μΩ-cm, respectively.

Aspect 27 is a tungsten film having a thickness of greater than 200 Å, and having a resistivity of about less than 15 μΩ-cm.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in the details, without exceeding the scope of the disclosure. The disclosure's scope is, of course, defined in the language in which the appended claims are expressed.

What is claimed is:

1. A method comprising exposing a substrate to WOCl$_4$ and a reducing gas in a reaction zone under:
   (a) a first set of process conditions to controllably etch a substrate, wherein the substrate comprises an Al$_2$O$_3$ film;
   (b) a second set of process conditions to controllably deposit tungsten onto a surface of the substrate, wherein the substrate comprises a film chosen from Al$_2$O$_3$, HfO$_2$, ZrO$_2$, W, Mo, Co, Ru, Ir, Cu, SiN, TiN, and SiO$_2$ films; or
   (c) a third set of process conditions to selectively deposit tungsten onto metal conducting W, Mo, Co, Ru, Ir, or Cu substrates, but not onto a neighboring nitride or dielectric oxide film, wherein the neighboring nitride or dielectric oxide film is adjacent to a metal conducting substrate of the metal conducting substrates.

2. The method of claim 1, wherein the first set of process conditions comprise a substrate temperature range of about 200° C. to about 1000° C., a WOCl$_4$ concentration of about 1200 ppm to about 20,000 ppm, and pressure of about 0.5 to about 500 Torr.

3. The method of claim 1, wherein the second set of process conditions comprise a substrate temperature range of about 200° C. to about 1000° C., a WOCl$_4$ concentration of about 5 ppm to about 1200 ppm, and pressure of about 0.5 to about 500 Torr.

4. The method of claim 1, wherein the third set of process conditions comprise a substrate temperature range of about 200° C. to about 1000° C., a WOCl$_4$ concentration of about 5 ppm to about 1200 ppm, a pressure of about 0.5 to about 500 Torr and a multitude of substrates including a conductive film substrate and a neighboring nitride or dielectric oxide film substrate, whereby tungsten metal is only deposited on the conducting metal film substrate, but not onto h neighboring nitride or dielectric oxide film substrate.

5. The method of claim 1, wherein the reducing gas is chosen from hydrogen, hydrazine, or an alkylated hydrazine.

6. The method of claim 2 wherein the reducing gas is hydrogen, and the hydrogen is fed into the reaction zone at a rate of about 0.1 to about 10 liters per minute.

7. A method comprising exposing a substrate comprising a film chosen from Al$_2$O$_3$ and SiO$_2$ films, to (i) WOCl$_4$ along with a carrier gas delivered from a precursor ampoule, and (ii) a reducing gas, in a reaction zone, wherein the pressure in the reaction zone is about 0.5 to 500 Torr; the substrate temperature is about 200° C. to 1000° C., the reducing gas flow rate is about 0.1 to 10 liters per minute, the carrier gas flow is from about 0.001 to 1 liters per minute, the concentration of WOCl$_4$ in the reaction zone is greater than 1000 ppm, and the precursor ampoule temperature is about 10° C. to about 180° C., whereby the substrate comprising a film chosen from Al$_2$O$_3$ and SiO$_2$ films is etched.

8. The method of claim 7, wherein the concentration of WOCl$_4$ in the reaction zone is about 1000 ppm to about 10,000 ppm.

9. The method of claim 7, wherein said substrate is sequentially
   (i) exposed to WOCl$_4$ precursor, followed by
   (ii) purging by vacuum or an inert gas, followed by
   (iii) exposure to a reducing gas, followed by
   (iv) purging by vacuum or an inert gas and repeating the sequence of (i) through (iv), until a desired amount of etching on the substrate has occurred.

10. The method of claim 7, wherein said substrate is exposed to a continuous flow of WOCl$_4$ precursor and reducing gas.

11. The method of claim 7, wherein said substrate is exposed to a continuous flow of reducing gas, while WOCl$_4$ precursor is pulsed into the reaction zone for predetermined periods of time.

12. The method of claim 7, wherein the concentration of WOCl$_4$ precursor in the reaction zone is about 2000 ppm to about 5000 ppm.

13. The method of claim 7, wherein the substrate temperature is about 300° C. to about 450° C.

14. A method comprising exposing a substrate comprising a film chosen from Al$_2$O$_3$ and SiO$_2$ films, to
   (i) WOCl$_4$ along with a carrier gas delivered from a precursor ampoule, and
   (ii) a reducing gas, in a reaction zone,
   wherein the pressure in the reaction zone is about 0.5 Torr to 500 Torr; the substrate temperature is about 200° C. to 1000° C., the reducing gas flow rate is about 0.1 to 10 liters per minute, the carrier gas flow is from about 0.001 to 1 liters per minute, the concentration of WOCl$_4$ is less than 1000 ppm, and the precursor ampoule temperature is about 10° C. to about 180° C.,
   whereby tungsten is deposited onto the surface of the substrate comprising a film chosen from Al$_2$O$_3$ and SiO$_2$ films.

15. The method of claim 14, wherein the concentration of WOCl$_4$ in the reaction zone is about 75 ppm to about 1000 ppm.

16. The method of claim 14, wherein the WOCl$_4$ precursor is pulsed into the reaction zone for a period of 0.05 to about 20 seconds, followed by an off period of 0.05 to about 120 seconds, and repeated for a desired number of pulses until a desired amount of deposition has occurred on the substrate.

17. The method of claim 16, wherein the WOCl$_4$ precursor is pulsed into the reaction zone for a period of 0.1 to about 10 seconds, followed by an off period of 1 to about 60 seconds.

18. The method of claim 14, wherein, said substrate is sequentially
   (i) exposed to WOCl$_4$ precursor, followed by
   (ii) purging by vacuum or an inert gas, followed by
   (iii) exposure to a reducing gas, followed by
   (iv) purging by vacuum or an inert gas, and repeating the sequence of (i) through (iv), until a desired amount of deposition of Tungsten on the substrate has occurred.

19. The method of claim 14, wherein said exposure is, wherein said substrate is exposed to a continuous flow of WOCl$_4$ precursor and reducing gas.

* * * * *